United States Patent
Lin et al.

(10) Patent No.: US 6,251,564 B1
(45) Date of Patent: Jun. 26, 2001

(54) METHOD FOR FORMING A PATTERN WITH BOTH LOGIC-TYPE AND MEMORY-TYPE CIRCUIT

(75) Inventors: Chin-Lung Lin, Kaohsiung; Yao-Ching Ku, Chiung-Lin Hsiang, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/312,968

(22) Filed: May 17, 1999

(51) Int. Cl.$^7$ ........................................ G03C 5/00
(52) U.S. Cl. ................. 430/311; 430/5; 430/22; 430/322
(58) Field of Search ................... 430/311, 5, 22, 430/322

(56) References Cited

U.S. PATENT DOCUMENTS 5,308,741 * 5/1994 Kemp .................................. 430/311
5,807,649 * 9/1998 Liebmann et al. ...................... 430/5

* cited by examiner

Primary Examiner—Geraldine Letscher

(57) ABSTRACT

A method for forming a pattern with both a logic-type and, a memory-type circuit is disclosed. The method includes first providing a wafer which includes a photoresist layer, then covering the photoresist layer with a first mask including an opaque area and a first pattern area. Forming a first pattern on the photoresist layer by a first exposure. Covering the photoresist layer with a second mask after the first mask is removed. Moreover, a second pattern is printed on the photoresist layer by a second exposure. Finally, the second mask is removed. The double-exposure method will enhance the resolution of the pattern defined on the photoresist layer.

14 Claims, 1 Drawing Sheet

METHOD FOR FORMING A PATTERN WITH BOTH LOGIC-TYPE AND MEMORY-TYPE CIRCUIT

BACKGROUND OF THE INVENTION

1. Field of the Invention

The present invention relates to a method for forming a pattern with both logic-type and memory-type circuit, and more particularly provides the application of masks in double-exposure process.

2. Description of the Prior Art

A mask for photolithography, replicated during printing, is a fundamental tool in the photoresist process. It consists of a transparent plate covered with a patterned film of opaque material. The plate is generally made of fused quartz. The advantages of quartz is that it is transparent to deep Ultra Violet ($\leq 365$ nm) and has a very low thermal expansion coefficient. The opaque material is typically a very thin ($\leq 100$ nm) film of chrome, covered with an anti-reflective coating (ARC), such as chrome oxide ($\leq 20$ nm), to suppress interferences at the wafer surface. A mask containing both transparent and opaque areas is used to print the pattern onto the photoresist coated on wafer. The light beams traverse the transparent areas of the mask to the surface of the photoresist and are resisted by the opaque areas.

In general, there are two kinds of circuit patterns that could be contained on the mask, and those include memory-type and logic-type. Therein, the memory-type circuit has a very high density and the logic-type circuit has a lower density with a very small critical dimension (CD). The critical dimension (CD) is the size of the most important (usually the smallest) line width, spacing, or contact hole.

It is necessary to apply an individual strategy of masks to the different kinds of patterns. Usually, memory-type circuit pattern is applied by the half-tone mask or the Levenson mask while the logic-type circuit pattern is applied by the phase-edge mask. For the E-DRAM pattern containing the two types of circuit, in general, it is very difficult to get a good resolution. Therefore, new strategies of masks for forming the pattern of E-DRAM need to be developed. They should not only improve the resolution of the image, but also should be economically fabricated to follow the trend of future development of E-DRAM.

SUMMARY OF THE INVENTION

In accordance with the present invention, methods are provided for forming a pattern that substantially enhances the resolution. In one embodiment, a wafer is provided which includes a photoresist layer. Then the photoresist layer is covered with a phase-edge mask which includes an opaque chrome area and a first pattern area. The first pattern is printed on the phtoresist layer by a first exposure then the photoresist layer is covered with a binary mask after the phase-edge mask is removed. A second pattern is printed on the photoresist layer by a second exposure and the binary mask is finally removed.

In another embodiment, the same processes are suggested. A phase-edge mask, too, is used as the first mask, but a half-tone mask is used instead of the binary one. In the third embodiment, a two-in-one mask including both the binary and the half-tone one is used as the second mask.

The application of mask strategy combines with the two exposure processes to enhance the resolution of the image of the pattern and to avoid the high cost of fabrication.

BRIEF DESCRIPTION OF THE DRAWING

The foregoing aspects and many of the attendant advantages of this invention will become more readily appreciated as the same becomes better understood by reference to the following detailed description, when taken in conjunction with the accompanying drawing, wherein.

DESCRIPTION OF THE PREFERRED EMBODIMENT

Figure 1:
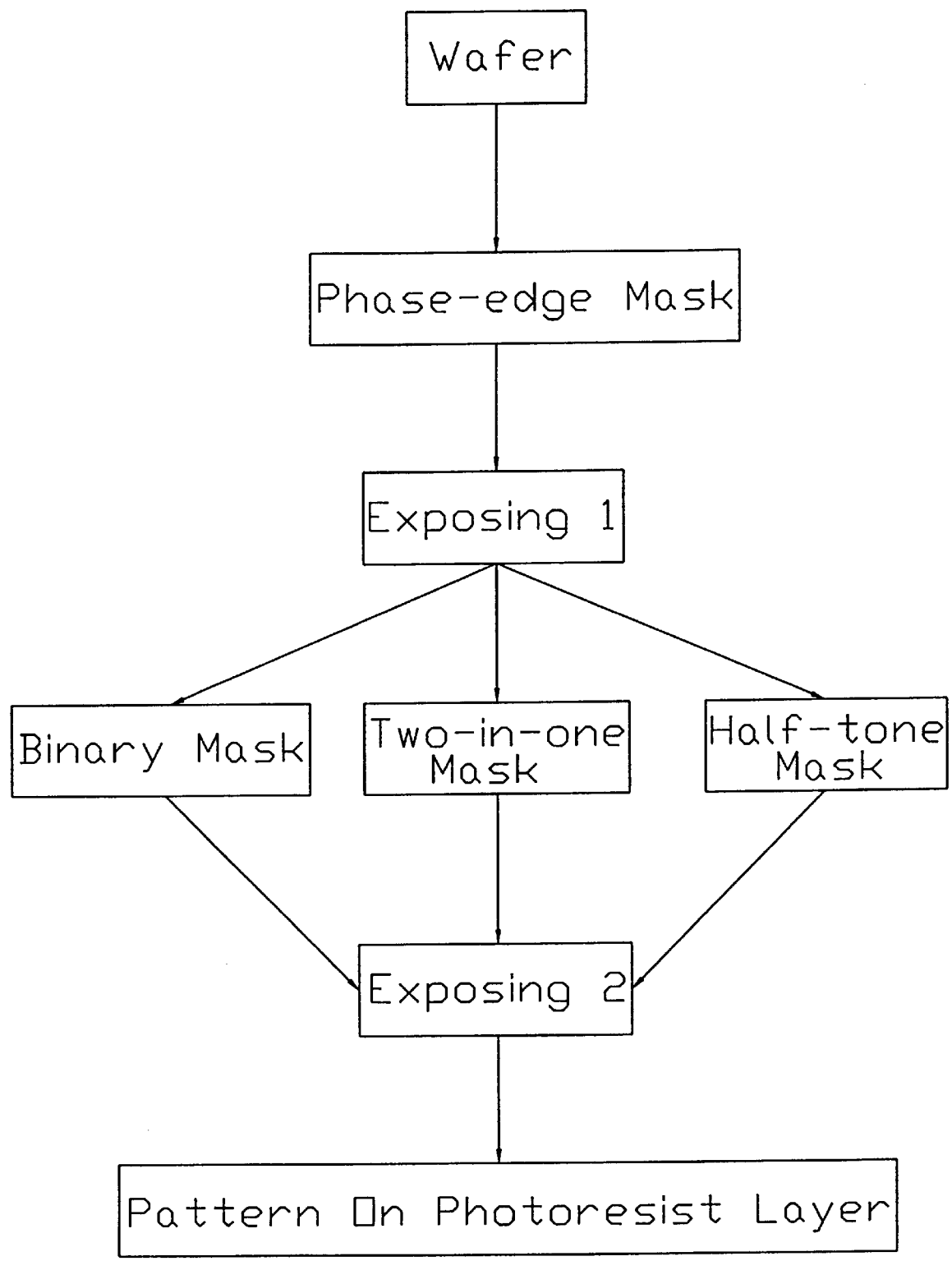
FIG. 1 shows the flow-chart of the present invention.

In the fabrication of embedded dynamic random access memory (E-DRAM), the present invention uses double exposure and application of mask strategies to enhance the resolution of the image of the pattern. The very high cost of fabrication would be avoided by the invention.

Firstly, a wafer is provided which includes a photoresist layer, then the photoresist layer is covered with a first mask including an opaque area and a first pattern area. The first pattern area contains the portion of the very small critical dimension of logic-type circuit. On the other hand, the opaque area which is coated with chrome (Cr) film is used to shade both the memory-type region and the portion of the wide critical dimension of logic-type circuit. The first mask employs a phase-edge mask which is one kind of phase shift mask (PSM). The deep ultra violet (DUV) light is projected through the mask onto the photoresist. The light through the fence-like portion of the pattern at the phase shift mask is bent and projected onto the dark features of the photoresist. The phenomenon described above is the diffraction effect, which could reduce the resolution of image of pattern on the photoresist and limits the result of the development process. To solve the drawback, it is necessary to form phase shifters on the transparent quartz plate. The DUV light beam traversing the phase shifters will be 180 degrees out of phase and interact with the adjacent beam. The interaction between the different light beams could result in the cancellation of intensity on the photoresist. This kind of mask described above is called "phase shift mask". Therein, the phase shifter of the phase-edge mask is located at the edge between the opaque feature and the transparent feature to enhance image contrast. For the features containing very small critical dimension, the higher resolution will be provided. After the phase-edge mask covers the photoresist, a first pattern is printed on the photoresist layer by using a first exposure process. Subsequently, the phase-edge mask is removed.

The photoresist is covered with the second mask on which is formed an opaque chrome film to shade the area exposed firstly. The pattern area of this mask contains a memory-type circuit and a logic-type circuit with wide critical dimension, then the traditional binary mask of half-tone mask is employed. The half-tone mask allows less than 6% DUV lightto traverse, so intensity of the light on the photoresist is not enough to provide the cross-link reaction of the photoresist. Therefore, the result of the developed process will not be reduced. This mask can shift the phase to enhance the image contrast and the resolution. After the mask process, a second pattern is defined on the photoresist layer by a second exposure. Lastly, the binary or half-tone mask is removed. Thus, the pattern having high resolution is achieved.

For defining the same pattern, a half-tone mask is better than a binary one in regard to resolution. However, the cost is higher for fabricating a half-tone mask. In another embodiment of the present invention, the first mask is the same as the precedent wherein the second mask is a two-in-one mask including both a binary mask and a half-tone mask. The pattern of dense circuitry (e.g., a memory-type circuit) is included in the half-tone mask, and the pattern of a sparse circuit is included in the binary mask. Therefore, not only is the resolution enhanced, but also the cost is reduced in the manufacture of the E-DRAM.

Although specific embodiments have been illustrated and described, it will be obvious to those skilled in the art that various modifications may be made without departing from what is intended to be limited solely by the appended claims.

What is claimed is:

1. A method for forming a pattern with both logic-type and memory-type circuit, comprising:

providing a wafer, which includes a photoresist layer;

covering said photoresist layer with a first mask including an opaque area and a first pattern area;

forming a first pattern on said photoresist layer by a first exposure, wherein said first pattern contains the portion of the very small critical dimension of said logic-type circuit;

removing said first mask;

covering said photoresist layer with a second mask, wherein said second mask contains said memory-type circuit and said logic-type circuit with wide critical dimension;

forming a second pattern on said photoresist layer by a second exposure; and removing said second mask.

2. The method according to claim 1, wherein said first mask comprises phase shift mask.

3. The method according to claim 1, wherein said opaque area comprises chrome (Cr) area.

4. The method according to claim 1, wherein said second mask is selected from the group consisting of binary mask and half-tone mask.

5. The method according to claim 2, wherein said phase shift mask comprises phase-edge mask.

6. A method for forming a pattern with both logic-type and memory-type circuit, comprising:

providing a wafer, which includes a photoresist layer;

covering said photoresist layer with a phase shift mask including an opaque chrome area and a first pattern area;

forming a first pattern on said photoresist layer by a first exposure, wherein said first pattern contains the portion of the very small critical dimension of said logic-type circuit;

removing said phase shift mask;

covering said photoresist layer with a binary mask, wherein said binary mask contains said memory-type circuit and said logic-type circuit with wide critical dimension;

forming a second pattern on said photoresist layer by a second exposure; and removing said binary mask.

7. The method according to claim 6, wherein said phase shift mask comprises phase-edge mask.

8. A method for forming a pattern with both logic-type and memory-type circuit, comprising:

providing a wafer, which includes a photoresist layer;

covering said photoresist layer with a phase shift mask including an opaque chrome area and a first pattern area;

forming a first pattern on said photoresist layer by a first exposure;

removing said phase shift mask;

covering said photoresist layer with a half-tone mask;

forming a second pattern on said photoresist layer by a second exposure; and removing said half-tone mask.

9. The method according to claim 8, wherein said phase shift mask comprises phase-edge mask.

10. A method for forming a pattern with both logic-type and memory-type circuit, comprising:

providing a wafer, which includes a photoresist layer;

covering said photoresist layer with a phase shift mask including an chrome opaque area and a first pattern area;

forming a first pattern on said photoresist layer by a first exposure, wherein said first pattern contains the portion of the very small critical dimension of said logic-type circuit;

removing said phase shift mask;

covering said photoresist layer with a two-in-one mask, wherein said two-in-one mask contains said memory-type circuit and said logic-type circuit with wide critical dimension;

forming a second pattern on said photoresist layer by a second exposure; and removing said second mask.

11. The method according to claim 10, wherein said phase shift mask comprises phase-edge mask.

12. A method for forming a pattern with both logic-type and memory-type circuit, comprising:

providing a wafer, which includes a photoresist layer;

covering said photoresist layer with a two-in-one mask;

forming a first pattern on said photoresist layer by a first exposure, wherein said first pattern contains the portion of the very small critical dimension of said logic-type circuit;

removing said two-in-one mask;

covering said photoresist layer with a phase shift mask including an opaque chrome area and a second pattern area, wherein said phase shift mask contains said memory-type circuit and said logic-type circuit with wide critical dimension;

forming a second pattern on said photoresist layer by a second exposure; and removing said phase shift mask.

13. A method for forming a pattern with both logic-type and memory-type circuit, comprising:

providing a wafer, which includes a photoresist layer;

covering said photoresist layer with a half-tone mask;

forming a first pattern on said photoresist layer by a first exposure, wherein said first pattern contains the portion of the very small critical dimension of said logic-type circuit;

removing said half-tone mask;

covering said photoresist layer with a phase shift mask including an opaque chrome area and a second pattern area, wherein said phase shift mask contains said memory-type circuit and said logic-type circuit with wide critical dimension;

forming a second pattern on said photoresist layer by a second exposure; and removing said phase shift mask.

14. A method for forming a pattern with both logic-type and memory-type circuit, comprising:

providing a wafer, which includes a photoresist layer;

covering said photoresist layer with a binary mask;

forming a first pattern on said photoresist layer by a first exposure, wherein said first pattern contains the portion of the very small critical dimension of said logic-type circuit;

removing said binary mask;

covering said photoresist layer with a phase-shift mask including an opaque chrome area and a second pattern area, wherein said second mask contains said memory-type circuit and said logic-type circuit with wide critical dimension;

forming a second pattern on said photoresist layer by a second exposure; and removing said phase shift mask.

* * * * *